United States Patent [19]

Tousignant et al.

[11] Patent Number: 5,205,348

[45] Date of Patent: Apr. 27, 1993

[54] SEMI-RIGID HEAT TRANSFER DEVICES

[75] Inventors: Lew A. Tousignant, St. Paul; Douglas E. Maddox, Minneapolis; Larry G. Headrick, Oakdale, all of Minn.

[73] Assignee: Minnesota Mining and Manufacturing Company, St. Paul, Minn.

[21] Appl. No.: 708,341

[22] Filed: May 31, 1991

[51] Int. Cl.$^5$ ............................................. F28F 3/14
[52] U.S. Cl. ........................................ 165/46; 165/170
[58] Field of Search ................ 165/46, 170, 169, 168

[56] References Cited

U.S. PATENT DOCUMENTS

| | | | |
|---|---|---|---|
| 2,991,627 | 7/1961 | Suits | 165/46 |
| 3,579,821 | 5/1971 | Kurisu | 29/627 |
| 3,586,102 | 6/1971 | Gilles | 165/186 |
| 3,996,092 | 12/1976 | Sarazin et al. | 165/170 |
| 4,009,423 | 2/1977 | Wilson | 361/385 |
| 4,072,188 | 2/1978 | Wilson et al. | 165/80 |
| 4,092,697 | 5/1978 | Spaight | 361/386 |
| 4,109,707 | 8/1978 | Wilson et al. | 165/46 |
| 4,138,692 | 2/1979 | Meeker et al. | 357/82 |
| 4,155,402 | 5/1979 | Just | 165/46 |
| 4,233,645 | 11/1980 | Balderes et al. | 361/385 |
| 4,287,883 | 9/1981 | Kyrias | 165/170 |
| 4,309,592 | 1/1982 | Le Boeuf | 165/46 |
| 4,323,914 | 4/1982 | Berndlmaier | 357/82 |
| 4,381,032 | 4/1983 | Cutchaw | 165/46 |
| 4,462,224 | 7/1984 | Dunshee et al. | 62/530 |
| 4,484,623 | 11/1984 | Rowe et al. | 165/170 |
| 4,524,757 | 6/1985 | Buckley | 165/46 |
| 4,551,787 | 11/1985 | Mittal et al. | 361/387 |
| 4,563,375 | 1/1986 | Ulrich | 428/35 |
| 4,574,876 | 3/1986 | Aid | 165/46 |
| 4,646,815 | 3/1987 | Iwata et al. | 165/170 |
| 4,777,561 | 10/1988 | Murphy et al. | 361/385 |
| 4,791,983 | 12/1988 | Nicol et al. | 165/80.4 |
| 4,920,574 | 4/1990 | Yamamoto et al. | 361/385 |
| 4,938,279 | 7/1990 | Betker | 165/46 |
| 4,997,032 | 3/1991 | Danielson et al. | 165/46 |
| 5,000,256 | 3/1991 | Tousignant | 165/46 |

FOREIGN PATENT DOCUMENTS

| | | | |
|---|---|---|---|
| 0151068A3 | 8/1985 | European Pat. Off. | |
| 60-39856 | 8/1983 | Japan | |
| 58-195792 | 11/1983 | Japan | |
| 59-130450 | 7/1984 | Japan | |
| 91192 | 5/1985 | Japan | 165/46 |
| 61-18159 | 1/1986 | Japan | |
| 63-221655 | 3/1987 | Japan | |
| 197709 | 9/1977 | U.S.S.R. | |
| 1435110 | 5/1976 | United Kingdom | |

Primary Examiner—John Rivell
Assistant Examiner—L. R. Leo
Attorney, Agent, or Firm—Gary L. Griswold; Walter N. Kirn; Mark W. Binder

[57] ABSTRACT

Semi-rigid heat transfer devices are provided for heating or cooling components, such as electrical components, wherein the heat transfer devices are sufficiently flexible to conform to the shapes of the components, but are sufficiently rigid to maintain its overall structural shape. Moreover, the heat transfer devices include at least a frame or support portion thereof and a layer of flexible film. The frame and film layer are advantageously heat sealable according to one aspect of the present invention. The degree of flexibility for a particular heat transfer device can be designed in accordance with the specific requirements of particular applications.

16 Claims, 4 Drawing Sheets

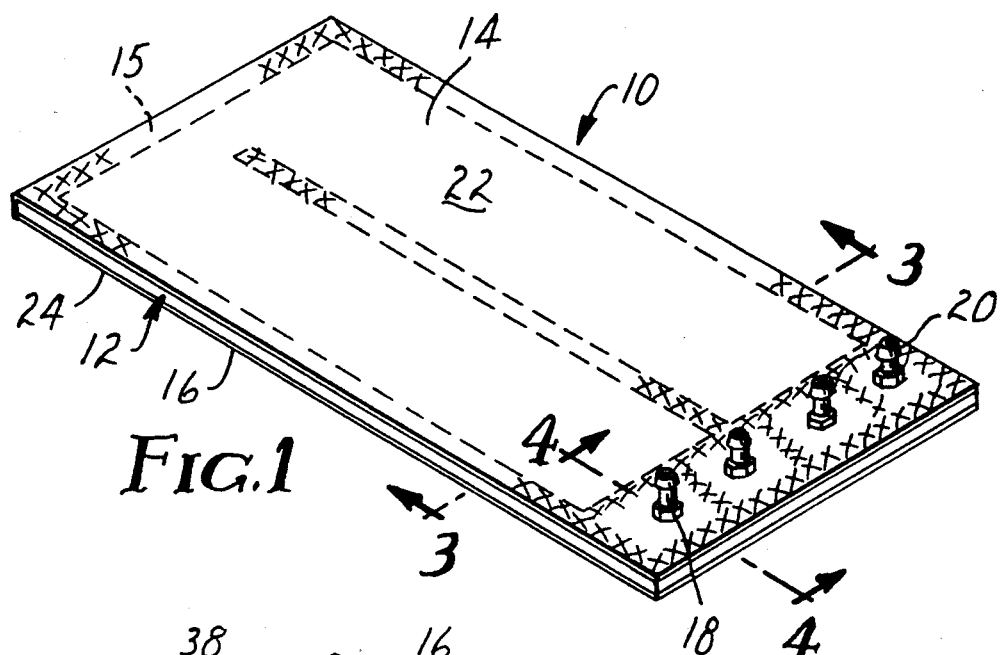
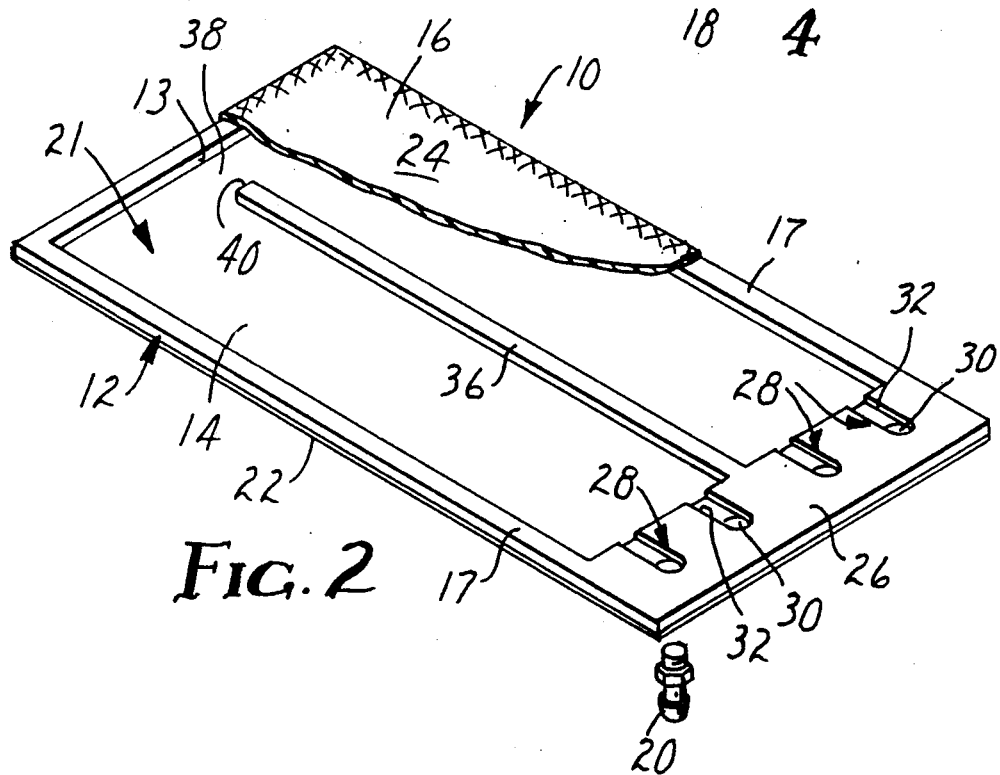
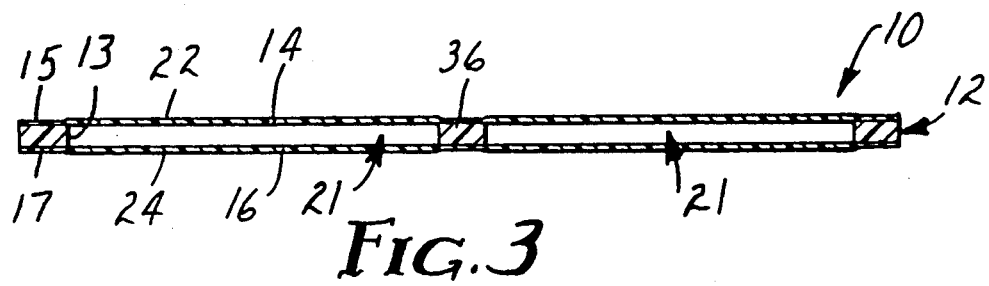

SEMI-RIGID HEAT TRANSFER DEVICES

TECHNICAL FIELD

The present invention relates to heat transfer devices useful for thermally affecting (heating or cooling) articles or systems of components, particularly electrical components and systems, wherein the heat transfer devices are substantially conformable to the component to insure good contact between the heat transfer device and the component to enhance thermal transfer.

BACKGROUND OF THE INVENTION

Many new heat transfer apparatuses and techniques have been developed over recent years in order to meet the growing needs for heat dissipation in more complex and denser electrical systems, electronic components and circuits thereof. Such techniques can be generally classified as either direct or indirect heat transfer.

Direct cooling techniques involve the use of a coolant medium, e.g. air or liquid, applied directly to the component or circuit for direct cooling. The disadvantage, of course, is that the component or circuit must be able to withstand such direct contact without adversely affecting the component or circuit. Moreover, in the case of using a liquid coolant, additional means is often required for collecting and possibly recycling the coolant medium.

Indirect cooling techniques usually involve a heat transfer fluid that is provided within a heat transfer device such that the heat transfer fluid dissipates or supplies heat through a structural component, such as a wall, of the heat transfer device. Typically, the heat transfer device is positioned so that the structural component or wall comes into direct contact with the component to be thermally affected. Such indirect heat transfer devices are defined as either: 1) a closed-type device, wherein a quantity of a heat transfer medium is sealed within the closed structure of the heat transfer device, and heat is transferred through the device between the component to be cooled and a heat sink which is otherwise cooled; or 2) a fluid circulating heat transfer type device, wherein the heat transfer fluid flows along a path defined within the device as part of a circuit when it is positioned against a component to be cooled. Fluid circulating heat transfer devices are typically provided as a component within a fluid circuit connected between a fluid source and drain.

A known thermal transfer device of the closed variety has recently been developed by the assignee of the present invention, Minnesota Mining and Manufacturing Company, and is described in U.S. Pat. No. 4,997,032 granted Mar. 5, 1991 to Danielson et al. The thermal transfer device is a thermal transfer bag, also known as the Liquid Heat Sink bag available from Minnesota Mining and Manufacturing Company as models Fluorinert TM Liquid Heat Sink FC-3260 and FC-3261. The bag is made of a sheet of flexible, durable, air-impermeable material and is filled with a thermally conductive, chemically inert, essentially gas free body of liquid which comprises fluorochemical liquid. The bag is placed between the heat generating component and a heat dissipating body, and conduction through the liquid as well as some movement of liquid within the bag due to convection currents transfer heat from the component to the heat dissipating body.

The aforementioned thermal transfer bag is advantageous in that the flexible material geometrically conforms to the configuration of the cavity within the electronic equipment, and comes into intimate contact with the heat generating components and the heat dissipating body to establish a thermal path therebetween. Moreover the inherent shock absorbing nature of a filled bag functions as a packing or cushion to help it protect the component from physical shock damage. The bag may be removed and replaced in the field during repair.

A modification of the above-described thermal transfer bag is described in U.S. Pat. No. 5,000,256, granted Mar. 19, 1991 to Tousignant and also owned by the assignee of the present invention. The modified thermal transfer bag is further provided with at least one metallic thermal via for improved heat transfer. The metallic thermal via extends through a hole in the bag for direct contact with an external surface of a heat generating component, and a portion of the via that extends within the bag functions as a heat radiating fin to enhance the transfer of heat to the liquid within the bag.

The thermal transfer bags disclosed in U.S. Pat. Nos. 4,997,032 and 5,000,256, however, can be difficult to use in certain situations where the thermal transfer bag is to be inserted between components that are relatively spatially fixed in place. As there becomes a need for increased quantities of heat transfer fluid within the bag for any reason, or in order to fill a wider gap between components, the increased quantity of fluid makes the thermal transfer bags rounder and eventually circular in transverse cross section. In other words, as the bags are filled with more heat transfer fluid they react similar to a balloon. Thus, as greater quantities are desired, it becomes increasingly difficult to fit such thermal transfer bags in the spaces between components and the effectiveness thereof is reduced along with their surface contact.

Other heat sink pillows or bags suffering from at least the aforementioned deficiency of thermal transfer bags are described in U.S. Pat. No. 3,586,102, granted Jun. 22, 1971 to Gilles and IBM Technical Disclosure Bulletin Vol. 19 No. 8, January, 1977. In each of these cases, a pillow or sack is filled with thermally conductive grease or liquids. Moreover, the grease or liquid is contained by one or more film layers.

Another type of heat transfer device is shown and described in U.S. Pat. No. 4,092,697, granted May 7, 1978 to Spaight. Specifically, a formable film layer is mounted on the underside of a rigid cover, wherein when the rigid cover is attached over a substrate with circuit devices thereon, the film containing a thermally conductive material between it and the rigid cover contacts the top surface of the circuit device. The thermally conductive material between the film and the rigid cover transfers heat generated from the device through the film layer to the rigid cover which is further provided with cooling fins. The rigid cover acts as a heat sink. This type of heat transfer device is even more limited in applications than the thermal transfer bags discussed above in that the thermal conductive material is provided within a film sack attached to a rigid cover assembly which must be mounted to the substrate to which circuit devices are mounted. There is very little versatility to such devices.

A similar heat transfer structure is described in U.S. Pat. No. 4,323,914, granted Apr. 6, 1982 to Berndlmaier. In this case, either the thermally conductive material is maintained within a film like sack attached to a rigid cover which acts as a heat sink and is secured to the circuit substrate, or the circuit device is coated with a protective layer so that thermal transfer liquid can contact the protective layer without detrimentally affecting or contaminating the circuit device.

Disclosed in U.S. Pat. No. 4,155,402, granted May 22, 1979 to Just is a cooling device including a compliant surface which contacts electric circuit components for cooling. A rigid channeled cooling plate is provided with a recessed surface, and the recessed surface is filled with a paste-like heat conductive material which is covered by a thin film attached to the base by adhesive. The film layer and the heat conductive paste within the rigid recessed cooling plate comprise the compliant surface. The Just device, however, is disadvantageous in that a very rigid device is created with only a compliant single surface. Moreover, such heat transfer devices are limited in applicability due to the rigid structural requirements thereof.

In general, the aforementioned prior art heat transfer devices lack the versatility to be applicable over a wide range of spaces between components that are to be thermally affected, i.e. heated or cooled, and which can be easily manufactured and replaced as necessary. Furthermore, very flexible heat transfer devices, such as the thermal transfer bags described above, cannot be easily used in relatively narrow or in relatively wide open spaces between components, while the very rigid type heat transfer devices are not versatile enough for such application.

SUMMARY OF THE INVENTION

The present invention relates to a heat transfer apparatus which overcomes the deficiencies associated with prior art heat transfer devices by providing a heat transfer apparatus with increased versatility for many types of applications, and which is compliant but sufficiently defined in shape such that the heat transfer apparatus is easily insertable between fixed components. Moreover, the contacting surfaces are sufficiently conformable to insure a good heat transfer contact with irregular surfaces of components.

More specifically, the present invention includes a flexible frame having an outwardly facing perimetric surface, and a layer of flexible film sealingly connected to the perimetric surface of the flexible frame, such that the layer of flexible film provides the external major surface of the heat transfer apparatus which contacts the article or component that is to be thermally affected by the heat transfer apparatus. Moreover, the flexible frame is more rigid than the flexible film layer, but is sufficiently flexible to provide a desired amount of flex of the heat exchange apparatus depending on the specific application. Furthermore, the heat transfer between the component and the heat transfer fluid takes place through the flexible film layer. In fluid circulating embodiments, the heat transfer apparatus includes an access means allowing heat transfer fluid to circulate through the interior of the heat transfer apparatus from the exterior thereof by way of a passage defined within the flexible frame and which is operatively connectable to a fluid reservoir. In closed-type embodiments, no access means is necessary, although such may be provided for filling or thermal expansion.

In another aspect of the present invention, the heat transfer apparatus comprises a support member of heat sealable material provided with a heat sealing surface. A first layer of flexible film is heat sealed to the heat sealing surface of the support member, wherein the support member is more rigid than the flexible film and the flexible film provides the external major surface which is to contact an article to be thermally affected. Heat transfer fluid is maintained within a fluid cavity defined by the support member and the layer of flexible film, and the heat transfer device preferably is provided with access means connecting the fluid cavity to a fluid reservoir, although a closed-type device is also contemplated.

In one embodiment, the support member comprises a perimetric frame which requires two layers of flexible film heat sealed to two different outwardly facing heat sealing surfaces of the perimetric frame such that the two layers of film with the perimetric frame define a single fluid cavity. In another case, the frame includes a web portion connected between a peripheral portion of the frame such that when two layers of film are applied to opposite sides of the frame, two fluid cavities result. The cavities may be in fluidic communication with one another or may be distinct. Moreover, access means may be provided to one of or both of such cavities.

According to the present invention, a versatile heat transfer apparatus is provided which is inexpensive to manufacture, requires a minimum of construction steps, and is flexible enough to insure good contact and thermal conductivity for use in many applications with sufficient flexibility which may be tailored depending on the desired application.

BRIEF DESCRIPTION OF THE DRAWINGS

FIG. 1 is a perspective view of a heat transfer device constructed in accordance with the present invention;

FIG. 2 is a perspective view of the heat transfer device shown in FIG. 1 with the heat transfer device turned over with the bottom side up and with a portion of the bottom film layer removed revealing the flexible frame thereof;

FIG. 3 is a cross-sectional view taken along line 3—3 in FIG. 1;

DETAILED DESCRIPTION OF THE PREFERRED EMBODIMENTS

Figure 4:
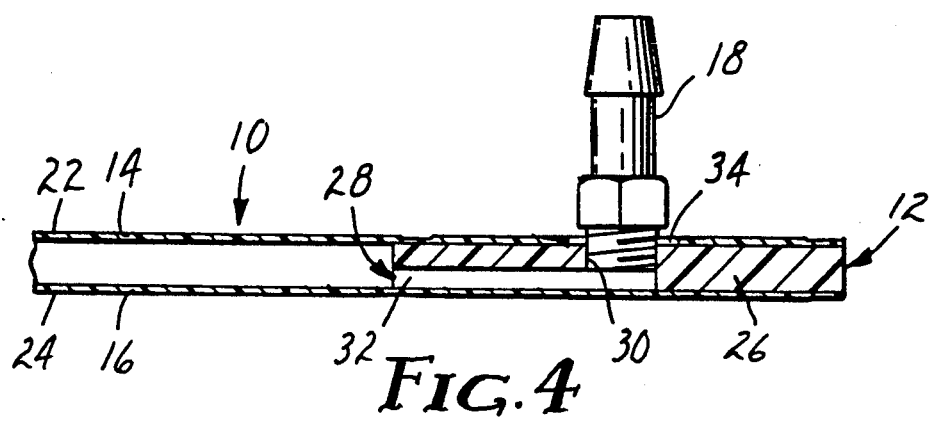
FIG. 4 is a cross-sectional view taken along line 4—4 in FIG. 1.

With reference now to the figures, and initially to FIGS. 1-4, wherein like numerals are used throughout the figures to refer to like components, a heat transfer device 10 is illustrated. The heat transfer device 10 is comprised of a frame 12, a first layer of flexible film 14, a second layer of flexible film 16 and a plurality of adapters for connecting the heat transfer device 10 to a heat transfer fluid source and drain lines (not shown). Specifically, two inlet adapters 18 and two outlet adapters 20 are included. It is understood that the inlet and outlet adapters 18 and 20, respectively, are necessary if the heat transfer device 10 is to be used as a circulating type heat exchanger wherein fluid is supplied to the heat transfer device 10 and then drained therefrom, and optionally cooled and re-supplied. Moreover, one or more inlet and outlet adapters 18 and 20 can be provided depending on flow and heat transfer requirements.

The first and second layers of flexible film 14 and 16 are affixed to the frame 12 so as to define a sealed fluid cavity 21 defined between the first and second layers 14 and 16 and the inner peripheral edge 13 of frame 12; see FIG. 2. The flexible film layers 14 and 16 are affixed to frame 12 at least along first and secton peripheral sealing surfaces 15 and 17, respectively. Preferably, the flexible film layers 14 and 16 and the frame 12 comprise materials which are heat sealable to one another such that the first layer of flexible film 14 is sealed to the first peripheral sealing surface 15 and the second layer of flexible film 16 is sealed to the second peripheral sealing surface 17 by heat sealing techniques. Such heat sealing techniques suitable for the present invention can be any conventional heat sealing technique. The preferred materials suitable for use as the flexible film layers 14 and 16 in the frame 12 will be discussed below. It is further understood that other techniques could be utilized for securing the film layers 14 and 16 to the frame 12 at peripheral sealing surfaces 15 and 17, such as using an adhesive layer or solder between the elements or using other mechanical fastening means.

The first and second flexible film layers 14 and 16, respectively, provide conformable external major surfaces 22 and 24 of the heat transfer device 10 which are for intimately contacting articles or components that are to be heated or cooled by the heat transfer device 10. The external major surfaces 22 and 24 are advantageously somewhat conformable to the shape of the article or component to be thermally affected by the heat transfer device 10 because they comprise the flexible film layers 14 and 16, respectively. The use of flexible film allows the external major surfaces 22 and 24 to pillow outwardly to a degree depending on the particular material chosen as the flexible film and the degree to which the flexible film layers 14 and 16 are affixed to the frame 12.

The flexible film material used for the top and bottom layers 14 and 16 may be made of a single or multilayer film of plastic, foil or combinations thereof and may optionally include a thermoplastic film since they are readily available and often are heat sealable. Further properties, details of construction and examples of suitable materials are set out in U.S. Pat. No. 4,997,032 entitled "Thermal Transfer Bag", granted Mar. 5, 1991 to Danielson et al, and U.S. Pat. No. 5,000,256 entitled "Heat Transfer Bag With Thermal Via", granted Mar. 19, 1991 to Tousignant, each of which disclosure is hereby entirely incorporated herein by reference.

The preferred material for the flexible films layers 14 and 16 comprises a multi-layer film which is made of the following layers, beginning with the layer which constitutes the external major surfaces 22 and 24 of the heat transfer device 10: (1) 3M No. 92 Kapton tape available from Minnesota Mining and Manufacturing Company of St. Paul, Minn.; and (2) American National Can Pantry Pack No. 50 film available from American National Can Company of Mount Vernon, Ohio. The 3M Kapton tape consists of 1.0 mil DuPont Kapton film type HN and 1.8 mil 3M adhesive No. 41-3200-1568-2 (which is a blend of silicone, toluene and xylene). The Pantry Pack film is a multi-layer film consisting of 0.48 mil PET polyester (which is placed next to the adhesive of the 3M Kapton tape), a laminating adhesive, a 0.50 mil aluminum foil, a laminating adhesive, and 3.0 mil modified polypropylene film. The latter polypropylene film thus represents the inner surface of the flexible film layers 14 and 16 which define the sealed cavity 21 by sealing thereof with the peripheral sealing surfaces 15 and 17.

The frame 12 may be comprised of any material which is flexible, heat sealable with the flexible film, or both. Such materials specifically include plastics and metals as well as many others. In accordance with the present invention, a flexible material is one which after construction of the heat transfer device 10 permits flexing of the heat exchanger 10 without permanent deformation while maintaining its function to permit heat transfer fluid to circulate therethrough. The degree of flexibility and manner thereof, whether torsional, perpendicular to or planar to the plane of the heat transfer device 10, or a combination thereof is preferably such that the heat transfer device 10 can flex when inserted between fixed objects which may experience changes in size or orientation when in use. The degree of flex depends on the particular material chosen for the frame 12 and the flexible film layers 14 and 16 as well as other construction features of the frame 12 as will be discussed more in detail below. In accordance with the present invention, flexibility is determined based on the minimum flexural rigidity of the frame in any orthoganal direction, which is the product of the modulus of elasticity of the frame material (E) multiplied by the moment of inertia ($I_Z$) of the appropriate cross-section of the frame. The minimum flexural rigidity is preferably below 4500 newton*$m^2$ to achieve sufficient overall flexibilty in at least one direction of the heat transfer device. Such a heat transfer device is elastically deformable in that direction by at least a significant amount.

Moreover, and in order to be heat sealable with the above-described preferred flexible film material, the frame 12 also preferably comprises a heat sealable material. By heat sealable, it is meant a material which can be heat sealed to a film layer by known or future developed heat sealing techniques. In the preferred construction of the present invention, the frame 12 is comprised of the same material as the innermost film layer that it is to be heat sealed with, which in the preferred embodiment comprises polypropylene.

As can be seen in FIG. 2, the frame 12 is provided with a widened support portion 26. Furthermore, the inlet and outlet adapters 18 and 20, respectively, are mounted to this support portion 26. To do this, the support portion 26 is provided with a like number of passages 28 as there are inlet and outlet adapters 18 and 20 combined. Moreover, the passages 28 each comprise a through hole portion 30 and a groove portion 32. The adapters 18 and 20 are connected to the through hole portions 30 in a sealable manner, preferably by threads, so that fluid flowing through the adapters 18 and 20 passes through the through hole portions 30. The groove portions 32 facilitate flow of fluid from the through hole portions 30 when the surface of support portion 26 is fixed with one of the layers of flexible film. By mounting the inlet and outlet adapters 18 and 20 to the support portion 26 of frame 12, it is advantageously easy to seal the inlet and outlet adapters 18 and 20 to the heat transfer device 10 without having to seal the flexible film to the inlet and outlet adapters 18 and 20. The flexible film need only be sealed to the support portion 26 of frame 12 around each of the inlet and outlet adapters 18 and 20 that pass through openings 34 (provided in top flexible film layer 14 in FIG. 4).

A fluid directing means is also preferably provided operatively between the passages 28 of the inlet adapters 18 and the outlet adapters 20. As shown in FIGS. 2 and 3, such a means comprises an extension element 36 which extends from the support portion 26 of frame 12. The extension element 36 directs heat transfer fluid flow from passages 28 of inlet adapters 18 along the longitudinal length of the heat transfer device 10, through an opening 38 provided between an end 40 of extension element 36 and the inner peripheral edge 13, then back along the longitudinal length of the heat transfer device 10 and out through passages 28 and outlet adapters 20. Preferably, although not required, the extension element is also fixed to the first and second flexible film layers 14 and 16 along upper and lower surfaces thereof to substantially divide the fluid cavity 21 into two equal zones. The inlet adapters 18 are to be connected with a heat transfer fluid source (not shown) and the outlet adapters 20 are to be connected with a drain line. The features of the source and drain do not form a part of the present invention and are not further described.

The extension element 36 can be designed in many different ways, although a straight element is illustrated. The extension element 36 could be curved or serpentined in order to enhance or specifically direct fluid flow depending on specific applications and heat transfer requirements.

The heat transfer device 10 is used by placement thereof in a location proximate to at least one article to be thermally affected thereby. By thermal affecting, it is meant either heating or cooling the article depending on the particular application. Such article would typically be an electronic device or an electrical system component which is to be cooled.

In a circulating type heat transfer device, the heat transfer fluid is supplied to the heat transfer device for circulation therein. In a closed-type device, the heat transfer fluid is sealed within the fluid cavity. Any known heat transfer fluid that is compatible with the materials of the heat transfer device can be used. Preferably, a fluorochemical liquid that is thermally conductive, chemically inert, essentially gas free and thermally stable is used. Particularly preferred liquids are Fluorinert TM Brand Electronic Liquids available from Minnesota Mining and Manufacturing Company of St. Paul, Minnesota.

The device of the present invention finds particular application in areas where some structural rigidity of the heat transfer device 10 is required and where it would be difficult to insert a thermal transfer type bag. One specific situation is where the heat transfer device 10 is to be inserted between components, such as electrical components within a system, that are relatively fixed in position. For example, within spaces defined by an array of batteries to be cooled. The thickness of the heat transfer device is preferably advantageously chosen such that the frame 12 comprises the majority of the gap between components and the film layers 14 and 16 when expanded by fluid pressure come in intimate contact with the components on both sides. Moreover, the present invention can be advantageously used in such a space between fixed components wherein the components are in an environment subject to shifting thereof or expanding thereof when heated.

It is also contemplated that the heat transfer device 10 be used between an article to be heated or cooled and a heat sink or heat source, depending on the situation, against the opposite external major surfaces 22 and 24. Moreover, the heat transfer device 10 could be a closed-type device for use in such a situation. In that case, no inlets or outlets are needed, although they may be for reasons other than circulation, and a quantity of heat exchange fluid is sealed in the cavity formed by the flexible film layer or layers and the frame. Heat would be transferred through the heat transfer device by a combination of conduction and convection.

The external major surfaces 22 and 24 also are advantageously conformable, depending on the degree of sealing thereof to the frame 12 and the material of the flexible film. Clearly, a relatively simple and inexpensive to manufacture heat transfer device is provided and which is suitable for use in relatively hostile environments subject to shifting components and between fixed irregular surfaces.

Figure 6:
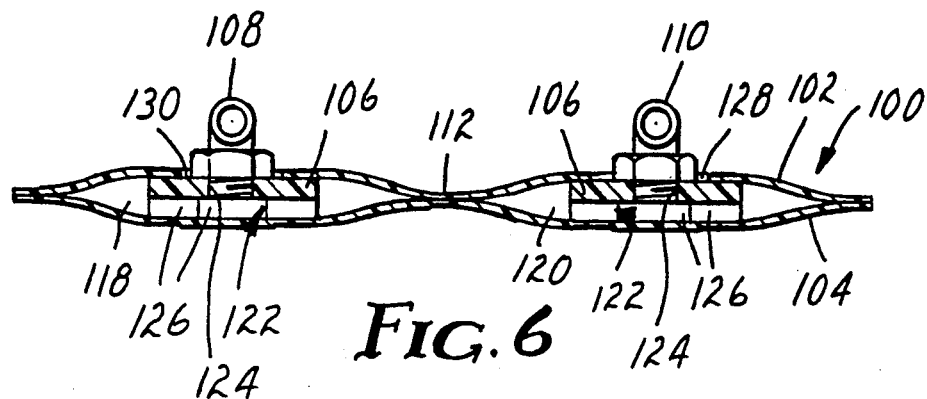
FIG. 6 is a cross-sectional view taken along line 6—6 in FIG. 5.
Figure 5:
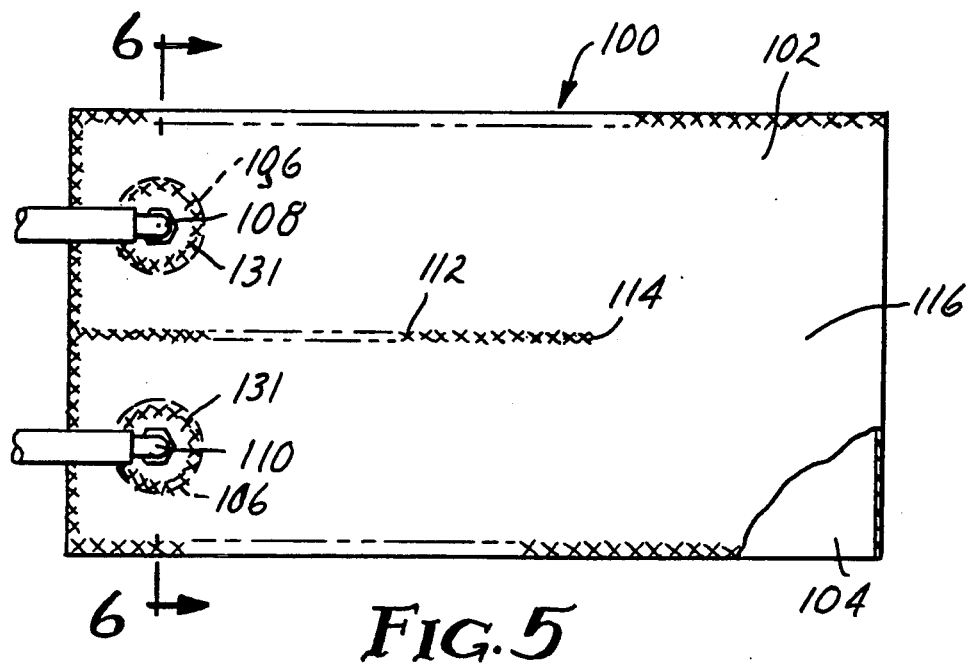
FIG. 5 is another heat transfer device formed in accordance with the present invention including support frame portion combined with a flexible thermal transfer bag.

Referring now to FIGS. 5 and 6, a second embodiment of a flexible heat exchanger 100 in accordance with the present invention is illustrated. Specifically, the heat transfer device 100 comprises a first layer of flexible film 102, a second layer of flexible film 104, two support frame portions 106, and inlet and outlet adapters 108 and 110, respectively. In the illustrated embodiment, only one inlet adapter 108 and one outlet adapter 110 are shown with the understanding that additional adapters could be provided in the same manner as that described below.

The flexible film used for the first and second layers 102 and 104 thereof may comprise any suitable film as enumerated above, and must be sealed together at their peripheral edges (that is along at least 3 sides if a single flexible sheet is folded). The manner of sealing can comprise any conventional technique including the use of adhesives and mechanical fastening means, with heat sealing being the preferred method. The support frame portions 106 are also preferably made of a heat sealable material. Moreover, a fluid directing means is operatively positioned between inlet adapter 108 and outlet adapter 110 by an extension line seal 112, preferably also a heat seal, shown extending longitudinally from one of the peripheral side sealing edges of the heat transfer device 100 and substantially bisecting the device into two zones 118 and 120. The extension line seal ends at a point 114 to provide a space 116 permitting fluid communication between both zones 118 and 120. In operation, fluid supplied through inlet adapter 108 flows longitudinally in the bag through the first zone 118, through space 116, through second longitudinal zone 120, and out outlet 110.

A support frame portion 106 is provided in each of the first and second zones 118 and 120 between the internal surfaces of the first and second layers of flexible film 102 and 104, respectively. Each support frame portion 106 includes a passage 122 comprised of a through hole portion 124 and a groove portion 126. The through hole portion 124 is used to mount the inlet or outlet adapters 108 or 110 therein and to permit fluid flow into groove portions 126 and then to the first and second zones 118 and 120 of the interior cavity of the heat transfer device 100. As illustrated in FIG. 6, two groove portions are preferably arranged perpendicularly to one another within the bottom surface of each support frame portion 106 to enhance fluid flow between adapters 108 and 110 and first and second zones 118 and 120, respectively. Many other groove arrangements are possible and within the scope of the present invention.

The first layer of flexible film 102, as illustrated, is provided with openings 128 through which adapters 108 and 110 pass. The first flexible film layer 102 is then sealed, preferably by heat sealing, at areas 131 to the upper surface 130 of each support frame portion 106 entirely around each adapter 108 and 110. Thus, as above, the adapters 108 and 110 are advantageously sealingly connected to the support frame portions 106 thus eliminating the need for a seal between the flexible film layer 102 and the adapters 108 and 110.

Figure 7:
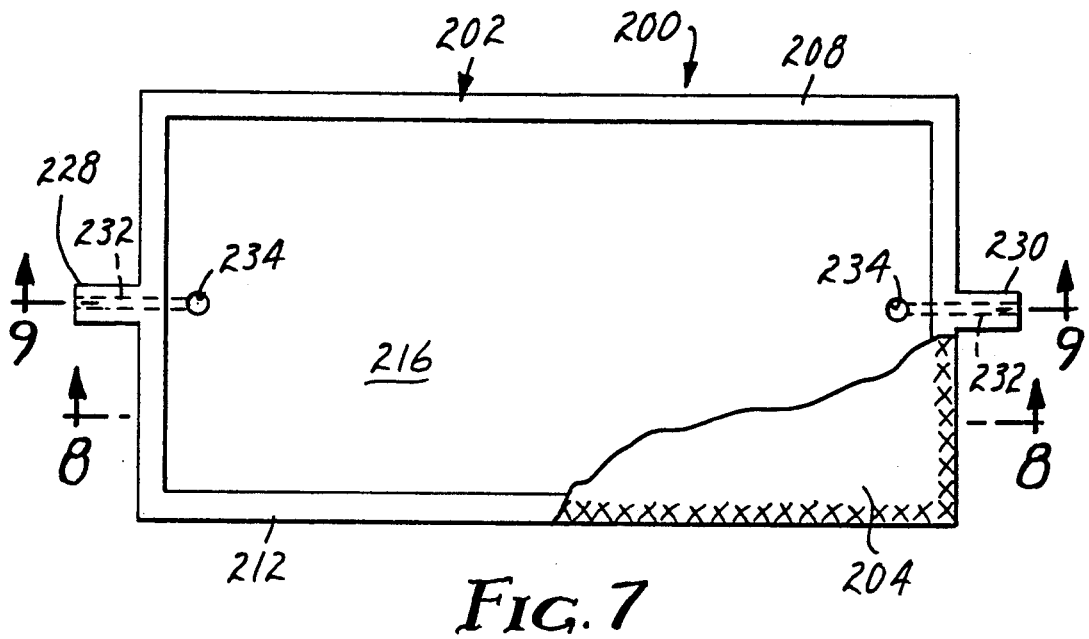
FIG. 7 is a plan view of yet another heat transfer device formed in accordance with the present invention with a portion of the top film layer removed to reveal the frame.
Figure 8:
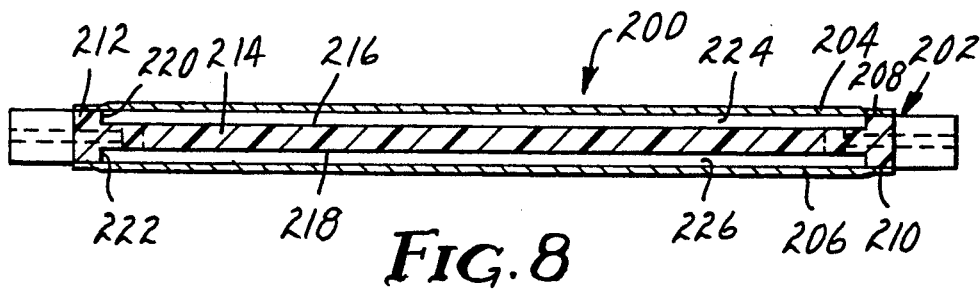
FIG. 8 is a cross-sectional view taken along line 8—8 in FIG. 7.
Figure 9:
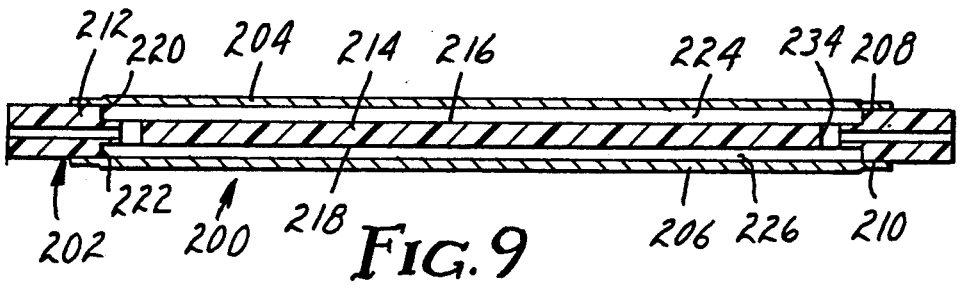
FIG. 9 is a cross-sectional view taken along line 9—9 in FIG. 7.

Referring now to FIGS. 7-9, a third embodiment of the present invention is shown. A heat transfer device 200 is comprised of a frame 202, a first layer of flexible film 204 and a second layer of flexible film 206. The materials comprising the frame and flexible film layers, as well as the manner of sealing the first and second layers 204 and 206 to the frame 202 are the same as that described above with regard to the first two embodiments. More particularly, the frame 202 includes first and second peripheral sealing surfaces 208 and 210, respectively, which are sealed to the first and second flexible film layers 204 and 206, respectively. The frame 202 comprises a peripheral portion 212 having the peripheral sealing surfaces 208 and 210 and a web portion 214 extending substantially entirely between the peripheral portion 212. The web portion 214 defines first and second surfaces 216 and 218 recessed from the peripheral sealing surfaces 208 and 210 by peripheral step surfaces 220 and 222, respectively.

When assembled, the inner surface of the first layer of flexible film 204, the first recessed surface 216, and the first peripheral step surface 220 define a first fluid cavity 224. The inside surface of the second layer of flexible film 206, the second recess surface 218, and the second peripheral step surface 222 define a second fluid cavity 226.

In order for heat transfer fluid to be circulated through at least one of or both of the first and second fluid cavities 224 and 226, an inlet 228 and an outlet 230 are provided. In this embodiment, the inlets and outlets are illustrated as formed integrally with the frame 202. Of course, the inlet and outlet could comprise adapters connected to the frame 202 as in the above described embodiments. In the same sense, any of the above described embodiments could substitute an integrally formed inlet or outlet for the adapters. Passages 232 are made within the inlet 228 and outlet 230 by bores connecting the outside of the heat transfer device 200 to perpendicular bores 234 provided through web 214. The perpendicular bores 234 not only provide access for fluid to flow into and out of the first and second fluid cavities 224 and 226, they also permit fluid flow between the first and second fluid cavities 224 and 226.

By this arrangement, heat transfer fluid provided from a fluid source (not shown) connected with inlet 228 flows through first passage 232, bore 234, both the first and second fluid cavities 224 and 226, second perpendicular bore 234, second passage 232 of outlet 230 and subsequently to a drain line (not shown). If it were desired to have heat transfer fluid flow through only one of the first and second fluid cavities 224 or 226, the perpendicular bores 234 would be commonly open to only one of the first and second fluid cavities 224 and 226 and closed to the other. The bores 234 would simply not be formed all the way through web 214. The other fluid cavity could be used as a closed-type heat transfer device that is filled with heat transfer fluid that is not circulated. Furthermore, it is contemplated to independently circulate fluid through the first and second fluid cavities 224 and 226. To do this, at least two inlets and two outlets must be provided with one set of inlet and outlet having a set of perpendicular bores commonly open to only one of the first and second fluid cavities 224 and 226, and the other set of inlet and outlet having a set of perpendicular bores commonly open to only the other of the first and second fluid cavities 224 or 226.

Figure 10:
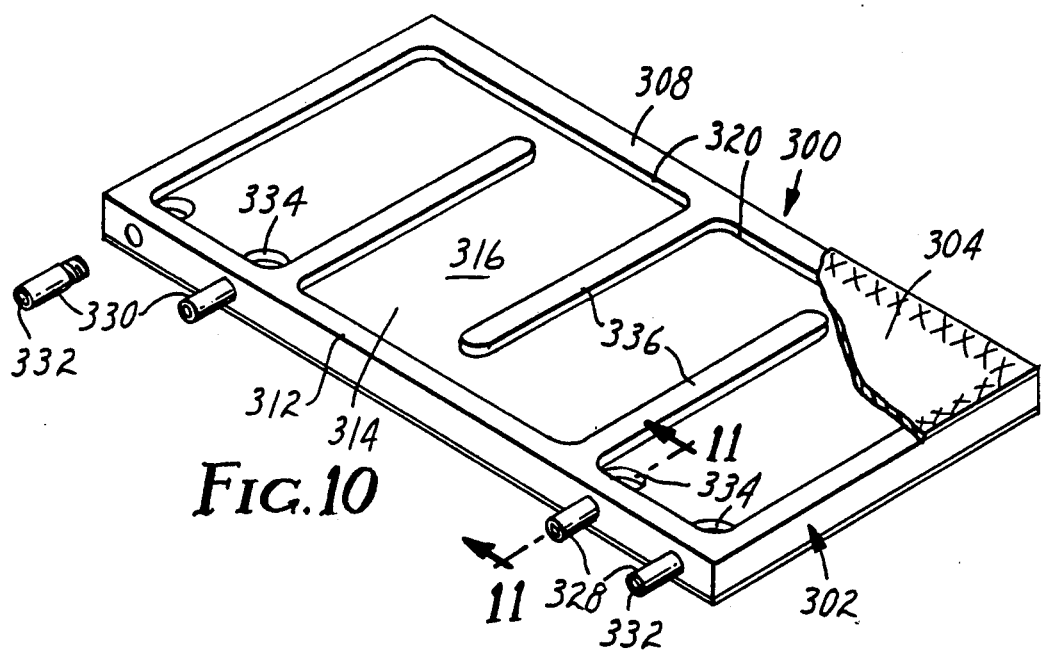
FIG. 10 is a perspective view of another heat transfer device in accordance with the present invention, wherein a fluid guide path is defined on a web portion of the frame.
Figure 11:
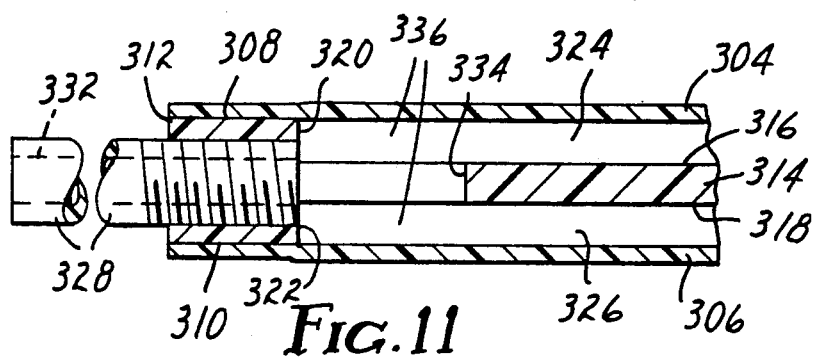
FIG. 11 is a cross-sectional view taken along line 11—11 in FIG. 10, but also with top and bottom film layers sealed to the frame.

Referring now to FIGS. 10 and 11, a further embodiment of a heat transfer device 300 formed in accordance with the present invention is illustrated. The heat transfer device 300 is most similar to the previously described heat transfer device 200 except that a particular flow path is defined on each side of the heat transfer device 300. Specifically, the heat transfer device 300 includes a frame 302, a first layer of flexible film 304 and a second layer of flexible film 306. Once again, the preferred materials are the same as that described above in the first embodiment. A first peripheral sealing surface 308 and a second peripheral sealing surface 310 are sealed, preferably heat sealed, to the first and second flexible film layers 304 and 306, respectively. The frame 302 is divided into a peripheral portion 312 and a web portion 314 substantially extending completely within the area inside of the peripheral portion 212. The web portion 314 is recessed from the first and second peripheral sealing surfaces 208 and 210 by first and second step surfaces 320 and 322 to make first and second recessed surfaces 316 and 318, respectively. A first fluid cavity 324 is defined by the inner surface of the first layer of flexible film 304, the first peripheral step surface 320 and the first recess surface 316. The second fluid cavity 326 is defined by the inner surface of the second layer of flexible film 306, the second peripheral step surface 322, and the second recess surface 318.

A pair of inlets are provided at 328 and a pair of outlets are provided at 330 Provided within each inlet and outlet 328 and 330 are passages 332 defined by bores which open from externally of the heat transfer device 300 into perpendicular bores 334. Note that the inlets and outlets 328 and 330 are shown as separate elements sealingly connected to the peripheral portion 312 of frame 302, with the understanding that they could be integrally formed with the frame 302 if desired. The perpendicular bores 334 also permit fluid communication between the first and second fluid cavities 324 and 326. An additional feature of this embodiment of the present invention is the provision of a plurality of extension elements 336 provided on both sides of the web portion 314 and having outermost surfaces at the same plane as the first and second peripheral sealing surfaces 308 and 310. The extension elements 336 define a serpentine fluid flow path on each side of the heat transfer device 300 within the first and second fluid cavities 324 and 326. As above, one or more inlets and outlets 328 and 330 can be provided depending on heat transfer requirements and flow rates, and one or both sides may comprise a circulating type heat transfer device or a closed type device. Moreover, the sides can function independently of one another.

Figure 12:
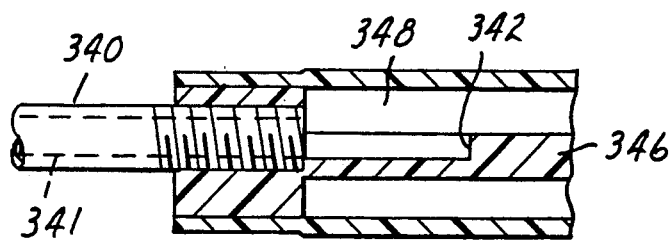
FIG. 12 is a view similar to FIG. 11 except that the heat transfer fluid inlet is shown opening to only one side of the heat transfer device.
Figure 13:
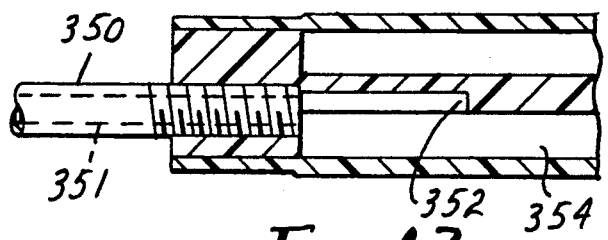
FIG. 13 is a view similar to FIG. 12 except that the heat transfer fluid inlet is open only to the other side of the heat transfer device than that of FIG. 12.

Further in this regard, FIG. 12 illustrates an inlet 340 including a bore 341 open from external of the heat transfer device to a partial perpendicular bore 342 which is open to only one side of the web portion 346 and into only a first fluid cavity 348. FIG. 13 is similar to FIG. 12 but showing the inlet 350 with a bore 351 opening to an oppositely directed partial perpendicular bore 352 and into a second fluid cavity 354. In each of these cases, outlets would be similarly provided with matching commonly directed perpendicular bores to provide a circulating heat transfer device on either side or independently on both sides of the apparatus.

The embodiments shown in FIGS. 7-9 and 10-13 are similar in that they include both a web portion and a peripheral portion of the frame. The web portion substantially affects the overall flexibility of such heat transfer devices and as such, can be advantageously designed to stiffen the flexible heat transfer devices depending on the particular application of use. The addition of and design of the web portion advantageously allows the overall flexibility of the heat transfer device to be easily modified for a specific application. In particular, the thickness of the web can be tailored to change the overall flexibility. Additionally, the web can comprise a variety of openings or discrete elements connected between the peripheral frame portion to modify and specifically tailor the overall flexibility of such a heat transfer device.

Moreover, any of the above described embodiments can be made as a closed type heat transfer device, a circulating type heat transfer device, or a combination of the two as desired for specific applications. A closed type device would be valuable where it is desired to transfer heat between a heat source and a heat sink. A recirculating type device can remove or supply heat to components and can easily be inserted in systems having space limitations and/or shifting components. Moreover, such heat transfer devices can be placed to affect plural components on one or both sides thereof.

Furthermore, a combination of plural heat transfer devices is contemplated. In the spirit of the FIGS. 7-9 and 10-13 embodiments, plural circulating type, closed-type and combination heat transfer devices can be fabricated. In the case of plural close-type devices, a web of the frame can separate compartments formed by the flexible film layers. Communication openings could advantageously be provided to allow fluid convection from one cavity to the other.

The frames and support frame portions described above can be advantageously inexpensively made, particularly in the case of plastic materials, by any conventional forming technique such as molding, machining, extrusion, or other. Preferably, they are made by a molding process, such as injection molding.

What we claim is:

1. A heat transfer apparatus for placement proximate to an article to be thermally affected thereby, comprising:
   a flexible frame including an outwardly facing perimetric surface; and
   a flexible film sealingly bonded to said perimetric surface of said flexible frame, said flexible film providing an external major surface of the heat transfer apparatus for contacting the article to be thermally affected;
   wherein said flexible frame is elastically deformable in at least one direction by a significant amount but is more rigid than said flexible film, and said flexible frame and said flexible film define a first fluid cavity for containing a quantity of heat transfer fluid for thermally affecting the temperature of the article by heat transfer through said flexible film.

2. The heat transfer apparatus of claim 1, further including access means for allowing the heat transfer fluid to flow between the interior and exterior of said first fluid cavity, said access means comprising a passage defined within said flexible frame and an adapter operatively connected with said flexible frame to be in fluidic communication with said passage.

3. A heat transfer apparatus for placement proximate to an article to be thermally affected thereby, comprising:
   a support member of heat sealable thermoplastic material having a heat sealing surface, and
   a first flexible film including a thermoplastic layer that is heat sealed to said heat sealing surface of said support member, said support member being more rigid than said flexible film, said flexible film providing an external major surface of the heat transfer apparatus for contacting the article to be thermally affected, and said flexible film and said support member together defining a first fluid cavity for containing a quantity of heat transfer fluid, wherein the temperature of the heat transfer fluid thermally affects the temperature of the article by heat transfer through said flexible film.

4. The heat transfer apparatus of claim 3, wherein said support member comprises a frame defining the perimetric edge of said heat transfer apparatus, and said heat sealing surface comprises a perimetric surface of said frame to which said flexible film is heat sealed.

5. The heat transfer apparatus of claim 4, further including a second flexible film including a thermoplastic layer that is heat sealed to a second perimetric heat sealing surface of said frame, said second flexible film defining with said first flexible film and said frame said first fluid cavity and providing a second major surface of said heat transfer apparatus.

6. The heat transfer apparatus of claim 5, further including a fluid inlet and outlet means for permitting heat transfer fluid to circulate through said first fluid cavity.

7. The heat transfer apparatus of claim 6, wherein said fluid inlet and outlet means comprises an inlet passage defined within said frame, a spaced outlet passage defined within said frame, an inlet adapter operatively connected to said inlet passage and for connection to a heat transfer fluid source, and an outlet adapter operatively connected to said outlet passage for connection to a drain.

8. The heat transfer apparatus of claim 7, wherein said frame includes a fluid directing means for guiding heat transfer fluid circulation through said first fluid cavity from said inlet passage to said outlet passage.

9. The heat transfer apparatus of claim 8, wherein said inlet and outlet passages are provided along a common edge portion of said frame and said fluid directing means comprises an extension portion extending from said common edge portion substantially to an opposite edge portion of said frame so as to divide said first cavity into a plurality of zones in fluidic communication, said first and second flexible films being heat sealed to said extension portion.

10. The heat transfer apparatus of claim 4, wherein said frame further includes a web interconnected with said perimetric heat sealing surface and recessed therefrom so as to define with said flexible film said first fluid cavity.

11. The heat transfer apparatus of claim 10, further including a second flexible film including a thermoplastic layer that is heat sealed to a second perimetric heat sealing surface of said frame, thereby providing a second major surface of said heat transfer apparatus and a second fluid cavity between said web and said second flexible film.

12. The heat transfer apparatus of claim 11, wherein at least one hole is provided through said web so that heat exchange fluid can pass between said first and second fluid cavities.

13. The heat transfer apparatus of claim 11, further including fluid inlet and outlet means for permitting fluid circulation through at least one of said first and second fluid cavities.

14. The heat transfer apparatus of claim 13, wherein said fluid inlet and outlet means comprises a first inlet passage defined within said frame opening to at least one of said first and second cavities from outside of said heat transfer apparatus and a first outlet passage distal from said first inlet passage opening from outside of said heat transfer apparatus to the one of said first and second fluid cavities into which said first inlet passage opens.

15. The heat transfer apparatus of claim 14, wherein at least one hole is provided through said web so that heat exchange fluid can circulate through both said first and second fluid cavities of said heat transfer apparatus.

16. A semi-rigid heat transfer apparatus for placement proximate to an article to be thermally affected thereby, comprising:
a flexible frame of heat sealable thermoplastic material including first and second outwardly facing perimetric surfaces;
a first flexible film including a thermoplastic layer that is heat sealed to said first perimetric surface of said support member, said first flexible film providing a first external major surface of the heat transfer apparatus for contacting the article to be thermally affected;
a second flexible film including a thermoplastic layer that is heat sealed to said second perimetric surface of said support member, said second flexible film providing a second external major surface of the heat transfer apparatus;
wherein said flexible frame is elastically deformable in at least one direction by a significant amount but is more rigid than said first and second flexible films, said flexible frame and at least one of said first and second flexible films define a first fluid cavity for containing a quantity of heat transfer fluid for thermally affecting the temperature of the article by heat transfer through one of said first and second flexible films.

* * * * *